(12) United States Patent
Beak et al.

(10) Patent No.: US 10,763,313 B2
(45) Date of Patent: Sep. 1, 2020

(54) DISPLAY DEVICE

(71) Applicant: LG Display Co., Ltd., Seoul (KR)

(72) Inventors: Jung-Sun Beak, Paju-si (KR);
Seong-Joo Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 28 days.

(21) Appl. No.: 15/977,972

(22) Filed: May 11, 2018

(65) Prior Publication Data
US 2018/0331160 A1    Nov. 15, 2018

(30) Foreign Application Priority Data

May 12, 2017    (KR) .................. 10-2017-0059426

(51) Int. Cl.
*G06F 3/041* (2006.01)
*H01L 27/32* (2006.01)
*H01L 51/50* (2006.01)
*H01L 51/52* (2006.01)
*G06F 3/044* (2006.01)

(52) U.S. Cl.
CPC ............ *H01L 27/323* (2013.01); *G06F 3/044* (2013.01); *G06F 3/0412* (2013.01); *H01L 27/322* (2013.01); *H01L 27/3262* (2013.01); *H01L 27/3276* (2013.01); *H01L 51/5012* (2013.01); *H01L 51/5206* (2013.01); *H01L 51/5221* (2013.01); *H01L 51/5253* (2013.01); *H01L 51/5284* (2013.01); *G06F 2203/04111* (2013.01); *G06F 2203/04112* (2013.01)

(58) Field of Classification Search
CPC .. G06F 2203/04111; G06F 2203/04112; G06F 3/0412; G06F 3/044; H01L 27/322; H01L 27/323; H01L 27/3262; H01L 27/3276; H01L 51/5012; H01L 51/5206; H01L 51/5221; H01L 51/5253; H01L 51/5284
See application file for complete search history.

(56) References Cited

U.S. PATENT DOCUMENTS

2017/0115786 A1* 4/2017 Kimura ................. G06F 3/044
2017/0315641 A1* 11/2017 Cai ...................... G06F 3/0412

* cited by examiner

*Primary Examiner* — Insa Sadio
(74) *Attorney, Agent, or Firm* — Seed Intellectual Property Law Group LLP

(57) ABSTRACT

Disclosed is a display device which may achieve process simplification and cost reduction. In the display device having touch sensors, the touch sensors are arranged on an encapsulation unit arranged to cover light emitting elements, and an anti-reflective film including a photosensitive material and a black pigment is arranged on routing lines connected to the touch sensors and a conductive layer arranged as an uppermost layer among a plurality of conductive layers included in the touch sensors. Thereby, visibility of external light may be improved by the anti-reflective film, and the touch electrodes are arranged on an encapsulation unit without a separate attachment process and, thus, process simplification and cost reduction of the display device may be achieved.

13 Claims, 12 Drawing Sheets

DISPLAY DEVICE

CROSS-REFERENCE TO RELATED APPLICATION(S)

This application claims the benefit of Korean Patent Application No. 10-2017-0059426, filed May 12, 2017, which is hereby incorporated by reference as if fully set forth herein.

BACKGROUND

Technical Field

The present disclosure relates to a display device, and more particularly, to a display device which may achieve process simplification and cost reduction.

Description of the Related Art

A touchscreen is an input device through which a user command may be input by selecting instructions displayed on a screen of a display device using a human hand or an article. That is, the touchscreen converts a contact position, which directly contacts a human hand or an article, into an electrical signal, and receives instructions selected at the contact position as an input signal. Such a touchscreen may substitute for a separate input device which is connected to the display device and thus operated, such as a keyboard or a mouse, and, thus, the range of use of the touchscreen tends to be gradually extended.

In general, a touchscreen is attached to a front surface of a display panel, such as a liquid crystal display panel or an organic electroluminescent diode display panel, through an adhesive. In this case, since the touchscreen is separately manufactured and then attached to the front surface of the display panel, an attachment process is added and, thus, the overall process is complicated and costs are raised.

BRIEF SUMMARY

Accordingly, the present disclosure is directed to a display device that substantially obviates one or more problems due to limitations and disadvantages of the related art.

An object of the present disclosure is to provide a display device which may achieve process simplification and cost reduction.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, in a display device having touch sensors, the touch sensors are arranged on an encapsulation unit arranged to cover light emitting elements, and an anti-reflective film including a photosensitive material and a black pigment is arranged on routing lines connected to the touch sensors and a conductive layer arranged as an uppermost layer among a plurality of conductive layers included in the touch sensors. Thereby, visibility of external light is improved by the anti-reflective film, and the touch electrodes are arranged on an encapsulation unit without a separate attachment process and, thus, process simplification and cost reduction of the display device are achieved.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings.

Figure 1:
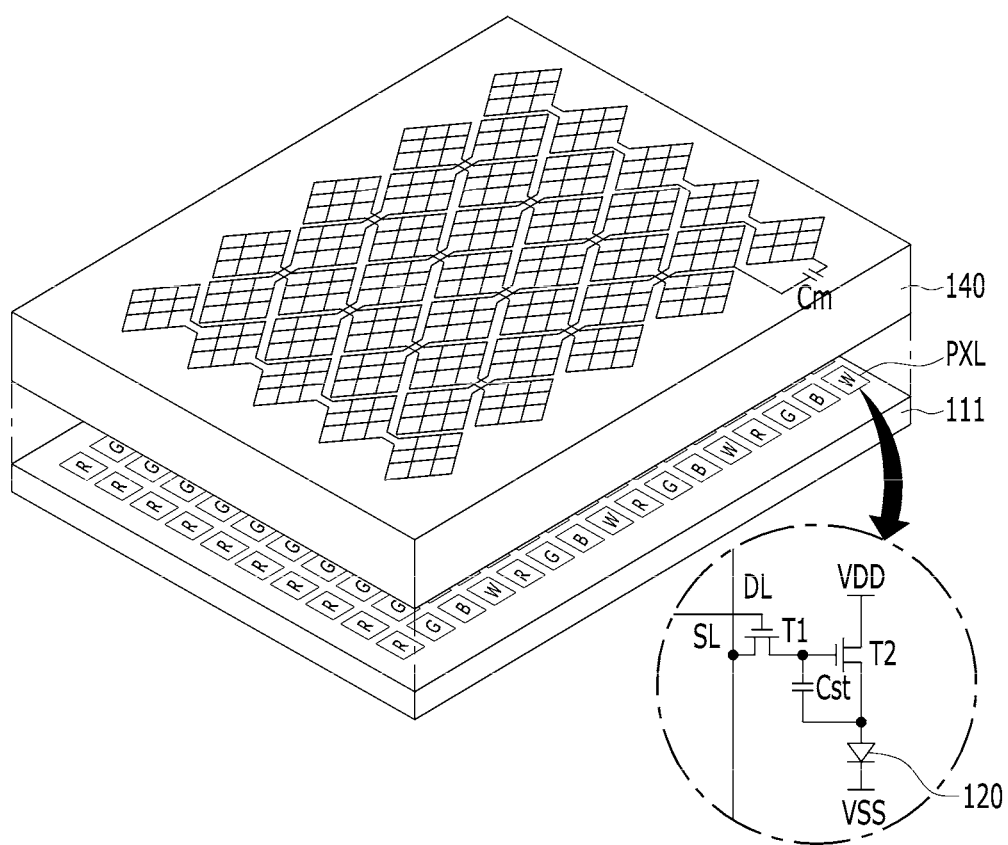
FIG. 1 is a perspective view illustrating an organic light emitting display device having touch sensors in accordance with one embodiment of the present disclosure.

FIG. 1 is a perspective view illustrating an organic light emitting display device having touch sensors in accordance with one embodiment of the present disclosure.

Figure 2:
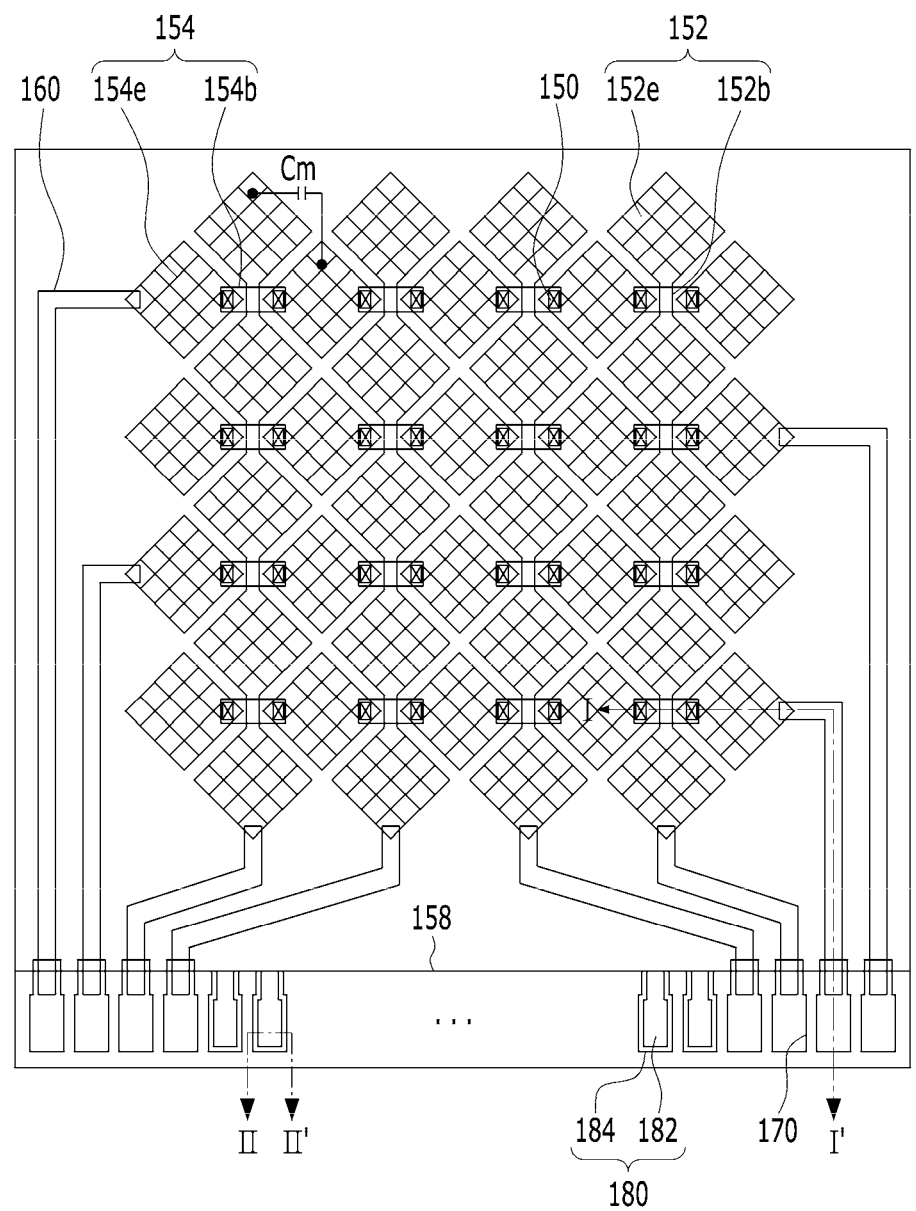
FIG. 2 is a plan view illustrating the organic light emitting display device shown in FIG. 1.

The organic light emitting display device shown in FIG. 1 senses whether or not user touch occurs and a touch position by sensing change in mutual capacitances Cm (touch sensors) due to the user touch through touch electrodes 152e and 154e shown in FIG. 2 during a touch period. Further, the organic light emitting display shown in FIG. 1 displays an image through unit pixels including light emitting elements 120. The unit pixel includes red (R), green (G) and blue (B) sub-pixels PXL, or includes red (R), green (G), blue (B) and white (W) sub-pixels PXL.

For this purpose, the organic light emitting display shown in FIG. 1 includes a plurality of sub-pixels PXL arranged in a matrix on a substrate 111, an encapsulation unit 140 arranged on the sub-pixels PXL, and mutual capacitances Cm arranged on the encapsulation unit 140.

Each of the sub-pixels PXL includes a pixel driving circuit and a light emitting element 120 connected to the pixel driving circuit.

The pixel driving circuit includes a switching transistor T1, a driving transistor T2 and a storage capacitor Cst.

When a scan pulse is supplied to a scan line SL, the switching transistor T1 is turned on and thus supplies a data signal, supplied to a data line DL, to the storage capacitor Cst and a gate electrode of the driving transistor T2.

The driving transistor T2 controls current I supplied from a high voltage (VDD) supply line to the light emitting element 120 in response to the data signal supplied to the gate electrode of the driving transistor T2, thus adjusting the amount of light emitted from the light emitting element 120. Further, even if the switching transistor T1 is turned off, the driving transistor T2 supplies regular current by voltage charging the storage capacitor Cst until a data signal of a next frame is supplied and, thus, the light emitting element 120 maintains light emission.

Figure 3:
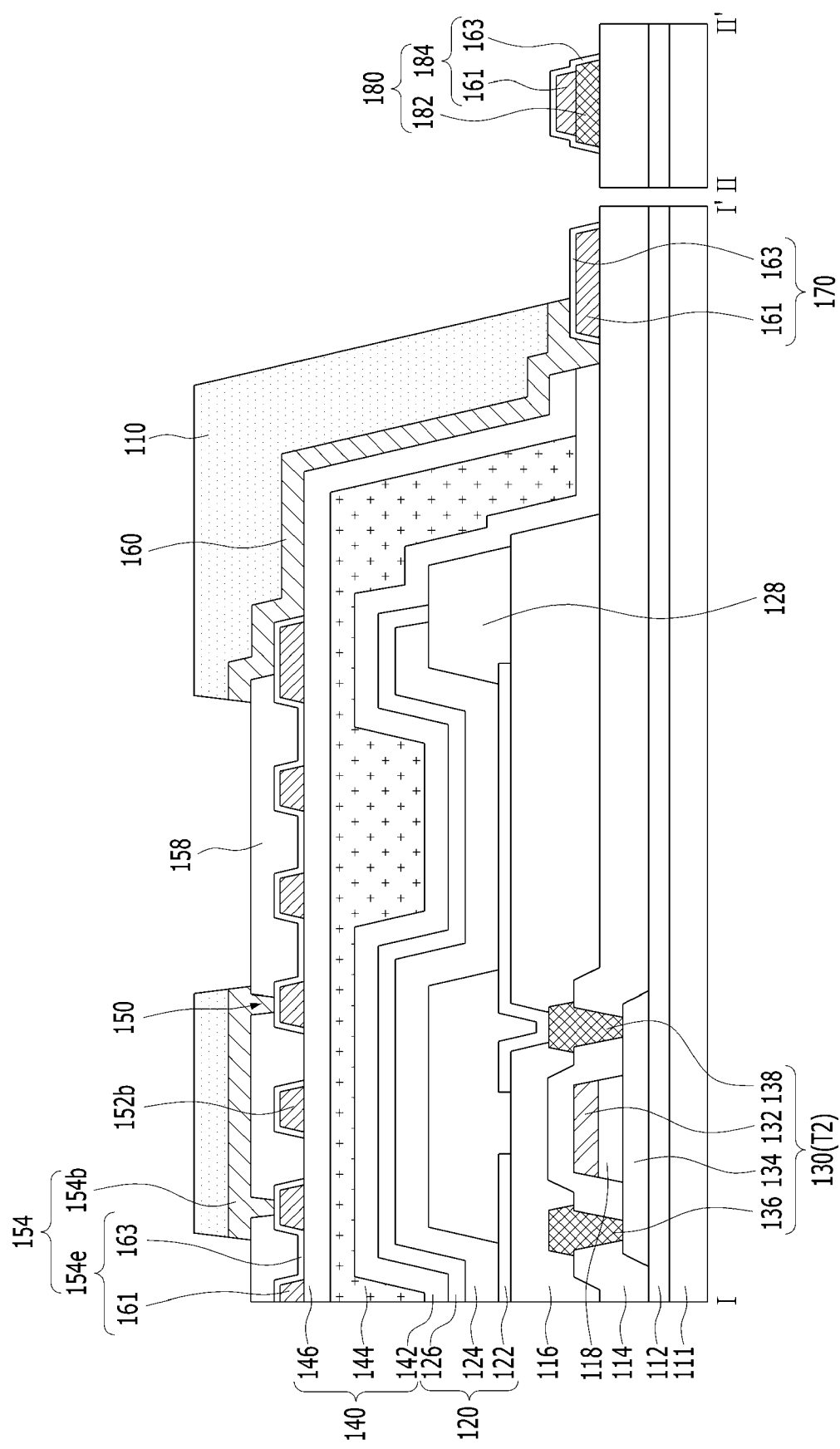
FIG. 3 is a cross-sectional view of the organic light emitting display device shown in FIG. 2, taken along lines I-I' and II-II'.

Such a driving thin film transistor T2 (denoted by 130 in FIG. 3) includes, as exemplarily shown in FIG. 3, a gate electrode 132, an active layer 134, and source and drain electrodes 136 and 138. The gate electrode 132 overlaps the active layer 134 with a gate insulating film 118 disposed therebetween. The source and drain electrodes 136 and 138 are formed on an interlayer insulating film 114 and contact the active layer 134. The active layer 134 is formed of at least one of an amorphous semiconductor material, a polycrystalline semiconductor material and an oxide semiconductor material, on a buffer layer 112. Here, the buffer layer 112 is arranged between the active layer 134 and the substrate 111 and prevents impurities from the substrate 111 from being introduced into the active layer 134. The interlayer insulating film 114 is arranged between the source and drain electrodes 136 and 138 and the gate electrode 132 and thus electrically insulates the source and drain electrodes 136 and 138 and the gate electrode 132 from each other.

The light emitting element 120 includes an anode 122, at least one light emitting stack 124 formed on the anode 122, and a cathode 126 formed on the at least one light emitting stack 124.

The anode 122 is conductively connected to the drain electrode 138 of the driving transistor 130 exposed through a pixel contact hole formed through a protective film 116. Here, the protective film 116 is formed of an inorganic insulating material or an organic insulating material, between the source and drain electrodes 136 and 138 and the light emitting element 120.

The at least one light emitting stack 124 is formed on the anode 122 in an emission area provided by a bank 128. The at least one light emitting stack 124 is formed by stacking a hole-related layer, an organic light emitting layer and an electron-related layer on the anode 122 in regular order or in reverse order. Further, the at least one light emitting stack 124 may include first and second light emitting stacks disposed opposite to each other with a charge generation layer CGL disposed therebetween. In this case, an organic light emitting layer of one of the first and second light emitting stacks generates blue light and an organic light emitting layer of the other of the first and second light emitting stacks generates yellow-green light and, thus, white light is generated through the first and second light emitting stacks. White light generated by the at least one light emitting stack 124 is incident upon color filters (not shown) located on or under the light emitting stack 124, thus implementing a color image. Otherwise, without separate color filters, each light emitting stack 124 may generate color light corresponding to each sub-pixel, thus implementing a color image. That is, the light emitting stack 124 of the red (R) sub-pixel may generate red light, the light emitting stack 124 of the green (G) sub-pixel may generate green light, and the light emitting stack 124 of the blue (B) sub-pixel may generate blue light.

The cathode 126 is formed opposite to the anode 122 with the at least one light emitting stack 124 disposed therebetween and is connected to a low voltage (VSS) supply line.

The encapsulation unit 140 prevents external moisture or oxygen from penetrating into the light emitting elements 120, which are vulnerable to external moisture or oxygen. For this purpose, the encapsulation unit 140 includes a plurality of inorganic encapsulation layers 142 and 146 and an organic encapsulation layer 144 arranged between the inorganic encapsulation layers 142 and 146, and the inorganic encapsulation layer 146 is arranged as the uppermost layer. Here, the encapsulation unit 140 includes at least two inorganic encapsulation layers 142 and 146 and at least one organic encapsulation layer 144. In the present disclosure, a structure of the encapsulation unit 140, in which the organic encapsulation layer 144 is arranged between the first and second inorganic encapsulation layers 142 and 146, will be exemplarily described.

The first inorganic encapsulation layer 142 is formed on the substrate 111 provided with the cathode 126 formed thereon so as to be located adjacent to the light emitting element 120. Such a first inorganic encapsulation layer 142 is formed of an inorganic insulating material which may be deposited at a low temperature, such as silicon nitride ($SiN_x$), silicon oxide ($SiO_x$), silicon oxynitride (SiON) or aluminum oxide ($Al_2O_3$). Since the first inorganic encapsulation layer 142 is deposited in a low-temperature atmosphere, damage to the light emitting stack 124, which is vulnerable to a high-temperature atmosphere, during a deposition process of the first inorganic encapsulation layer 142 may be prevented.

The organic encapsulation layer 144 serves as a buffer to damp stress between respective layers according to bending of the organic light emitting display device and strengthens planarization performance of the organic light emitting display device. The organic encapsulation layer 144 is formed of an organic insulating material, such as acrylic resin, epoxy resin, polyimide, polyethylene or silicon oxycarbide (SiOC).

The second inorganic encapsulation layer 146 is formed to cover the upper and side surfaces of the organic encapsulation layer 144 and the upper surface of the first inorganic encapsulation layer 142 exposed by the organic encapsulation layer 144. Thereby, the second inorganic encapsulation layer 146 minimizes and prevents penetration of external moisture or oxygen into the first inorganic encapsulation layer 142 and the organic encapsulation layer 144. The second inorganic encapsulation 146 is formed of an inorganic insulating material, such as silicon nitride ($SiN_x$), silicon oxide ($SiO_x$), silicon oxynitride (SiON) or aluminum oxide ($Al_2O_3$).

Touch sensing lines 154 and touch driving lines 152 are arranged on the encapsulation unit 140 so as to intersect each other with a touch insulating film 158 disposed therebetween. The term "intersect" is used herein to mean that one element crosses over or overlaps another element, and does not necessarily mean that the two elements contact each other. For example, the touch sensing line 154 and touch driving line 152 may intersect each other, but may not physically contact one another since the touch insulating film 158 is positioned therebetween. Mutual capacitances Cm are formed at the intersections between the touch sensing lines 154 and the touch driving lines 152. Therefore, the mutual capacitance Cm is charged with charges by a touch driving pulse supplied to the touch driving line 152 and discharges the charges to the touch sensing line 154, thus serving as a touch sensor.

The touch driving line 152 includes a plurality of first touch electrodes 152e and first bridges 152b to conductively connect the first touch electrodes 152e.

The first touch electrodes 152e are spaced apart from each other at regular intervals in a first direction, i.e., the Y-axis direction, on the second encapsulation layer 146. Each of the first touch electrodes 152e is conductively connected to the adjacent first touch electrode 152e through the first bridge 152b.

The first bridges 152b are arranged on the second inorganic encapsulation layer 146 so as to be coplanar with the first touch electrodes 152e, and are conductively connected to the first touch electrodes 152e without separate contact holes.

The touch sensing line 154 includes a plurality of second touch electrodes 154e and second bridges 154b to conductively connect the second touch electrodes 154e.

The second touch electrodes 154e are spaced apart from each other at regular intervals in a second direction, i.e., in the X-axis direction, on the second encapsulation layer 146. Each of the second touch electrodes 154e is conductively connected to the adjacent second touch electrode 154e through the second bridge 154b. In the same manner as the first touch electrodes 152e, the second touch electrodes 154e have a structure in which first and second conductive layers are stacked.

The second bridges 154b are formed on the touch insulating film 158 and are conductively connected to the second touch electrodes 154e exposed through touch contact holes 150 formed through the touch insulating film 158. In the same manner as the first bridges 152b, the second bridges 154b are arranged so as to overlap the bank 128 and, thus, lowering of an aperture ratio due to the first and second bridges 152b and 154b may be prevented.

Each of the first and second touch electrodes 152e and 154e and the first bridges 152b is formed to have a monolayer structure or a multilayer structure using an opaque conductive layer 161 having high corrosion resistance and acid resistance and excellent conductivity, such as Al, Ti, Cu and Mo. Each of the first and second touch electrodes 152e and 154e and the first bridges 152b includes the opaque conductive layer 161 and a transparent conductive layer 163 arranged on or under the opaque conductive layer 161. For example, the opaque conductive layer 161 has a three-layer structure, such as Ti/Al/Ti or Mo/Al/Mo, and indium tin oxide (ITO) or indium zinc oxide (IZO) is used as the transparent conductive layer 163. Here, the opaque conductive layer 161 may be formed as a mesh on the second inorganic encapsulation layer 146, as exemplarily shown in FIG. 3, or be formed as a mesh on the transparent conductive layer 163, as exemplarily shown in FIG. 4. Resistance and capacitance of the transparent conductive layer 163 are reduced by the mesh-type opaque conductive layer 161 and, thus, an RC time constant may be lowered and touch sensitivity may be improved. Further, the mesh-type opaque conductive layer 161 has a very thin line width and, thus, lowering of an aperture ratio and transmittance due to the mesh-type opaque conductive layer 161 may be prevented.

The touch driving lines 152 and the touch sensing lines 154 including the touch electrodes 152e and 154e and the bridges 152b and 154b are connected to a touch driving unit (not shown) through routing lines 160 and touch pads 170 arranged in a non-active (bezel) area.

Thereby, the routing lines 160 transmit a touch driving pulse generated by the touch driving unit to the tough driving lines 152 through the touch pads 170, and transmit a touch signal from the touch sensing lines 154 to the touch pads 170.

The routing lines 160 are arranged between the first and second touch electrodes 152e and 154e and the touch pads 170 so as to be connected to the first and second touch electrodes 152e and 154e and the touch pads 170. The routing lines 160 connected to the first touch electrodes 152e are extended in at least one of the upward and downward directions of the active area and are connected to the touch pads 170, as exemplarily shown in FIG. 2. The routing lines 160 connected to the second touch electrodes 154e are extended in at least one of the leftward and rightward directions of the active area and are connected to the touch pads 170. Arrangement of the routing lines 160 is not limited to the structure of FIG. 2 and may be variously changed according to design specifications of the display device.

Figure 4:
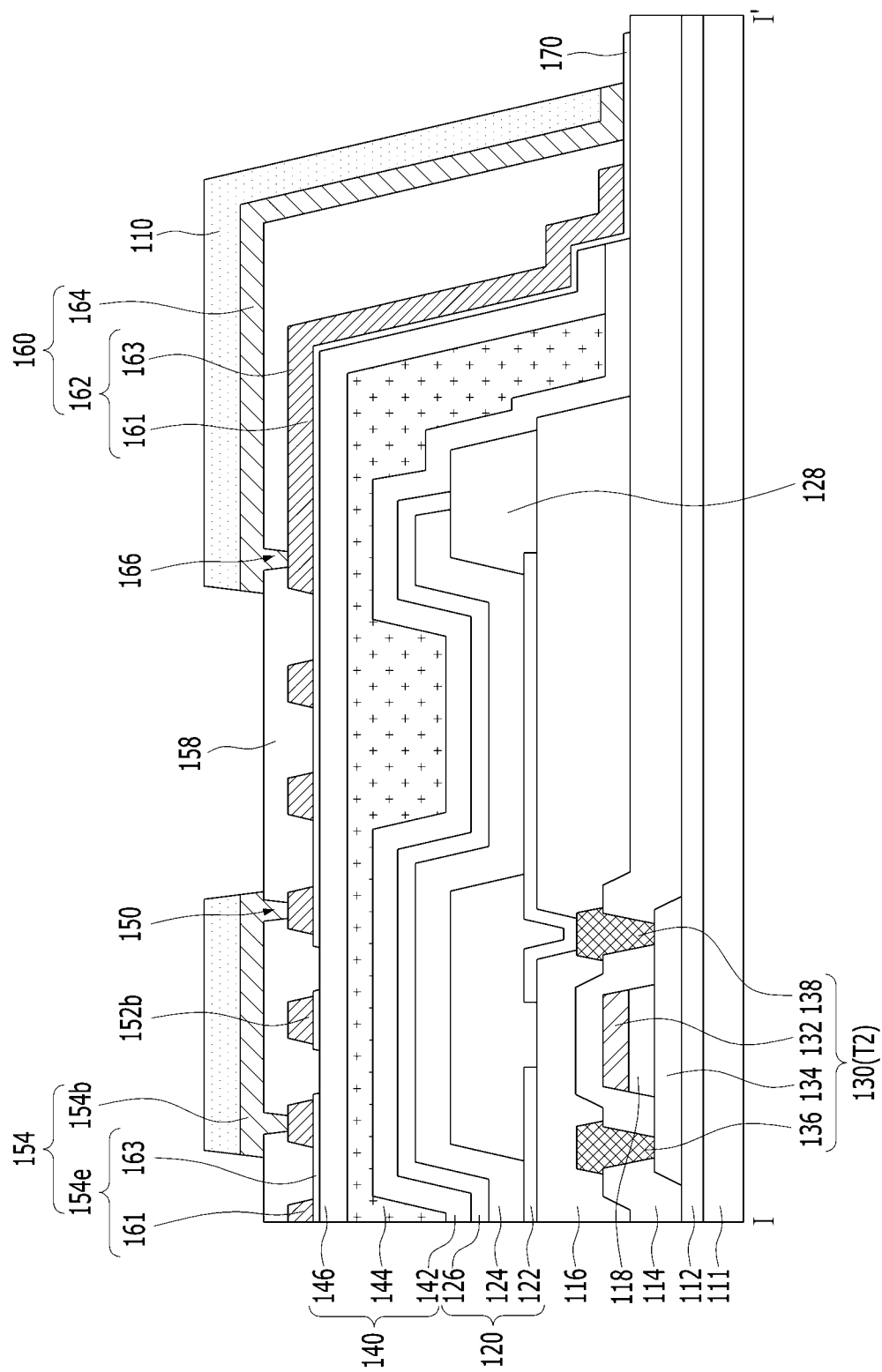
FIG. 4 is a cross-sectional view illustrating another embodiment of touch electrodes shown in FIG. 3.
Figure 5:
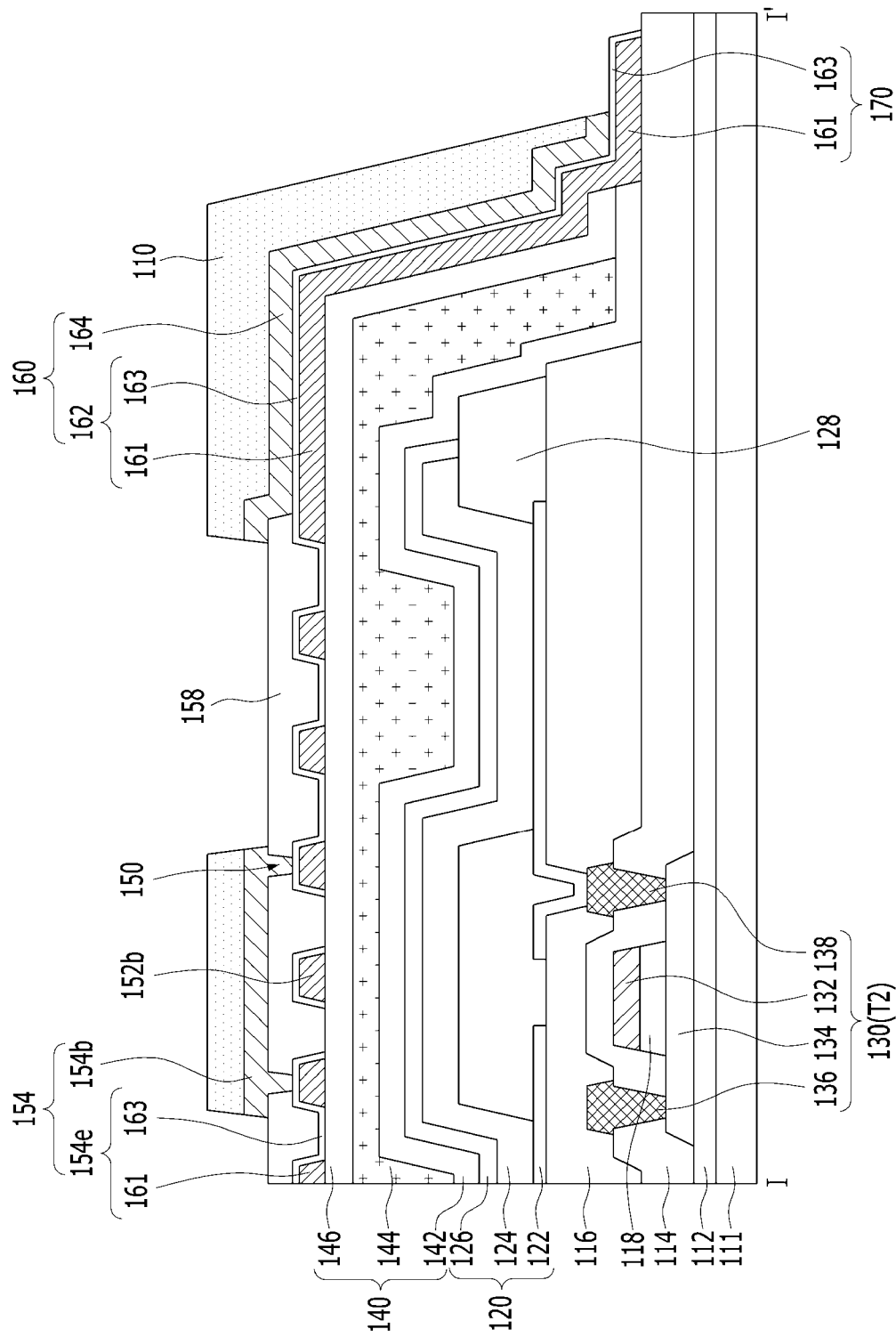
FIG. 5 is a cross-sectional view illustrating another embodiment of touch pads shown in FIG. 3.

Such routing lines 160 may have a monolayer structure, as exemplarily shown in FIG. 3, or have a multilayer structure, as exemplarily shown in FIGS. 4 and 5.

The routing lines 160 having a monolayer structure shown in FIG. 3 are formed of the same material as the second bridges 154b so as to cover the side surfaces of the encapsulation unit 140 while contacting the side surfaces of the encapsulation unit 140. Further, each of the routing lines 160 shown in FIG. 3 is formed to cover the other side surface and a part of an upper surface of each of the first and second touch electrodes 152e and 154e arranged at the outer region of the substrate 111 and is thus connected to each of the first and second touch electrodes 152e and 154e. Further, each of the routing lines 160 shown in FIG. 3 is formed to cover one side surface and a part of an upper surface of each of the touch pads 170 and is thus connected to each of the touch pads 170.

The routing lines 160 shown in FIGS. 4 and 5 include lower routing lines 162 and upper routing lines 164.

The lower routing lines 162 are formed of the same material as the first bridges 152b through the same mask process as the first bridges 152b. The lower routing lies 162 are formed to cover the side surfaces of the encapsulation unit 140 while contacting the side surfaces of the encapsulation unit 140. The upper routing lines 164 are formed of the same material as the second bridges 154b through the same mask process as the second bridges 154b. The upper routing lines 164 contact the lower routing lines 162 through routing contact holes 166 formed through the touch insulating film 158, as exemplarily shown in FIG. 4, or directly contact the lower routing lines 162 exposed by the touch insulating film 158 without separate contact holes, as exemplarily shown in FIG. 5. As such, the routing lines 160 shown in FIGS. 4 and 5 are formed to have a multilayer structure and, thus, resistance of the routing lines 160 may be reduced. Further, even if disconnection of one of the upper and lower routing lines 162 and 164 occurs, a touch driving pulse and a touch signal may be transmitted through the remaining routing line and, thus, reliability may be improved.

Each of the routing lines 160 having a multilayer structure shown in FIGS. 4 and 5 extends from the other side surface of each of the first and second touch electrodes 152e and 154e arranged at the outer region of the substrate 111 and is connected to each of the first and second touch electrodes 152e and 154e. Further, among the routing lines 160 shown in FIGS. 4 and 5, the lower routing lines 162 extend to an edge region of the substrate 111 outside the upper routing lines 164 and are connected to the touch pads 170.

The touch pads 170 are formed to be exposed to the outside and are thus connected to a signal transmission film on which the touch driving unit (not shown) is mounted. The touch pads 170, together with display pads 180 connected to at least one of the data line, the gate line, the low voltage supply line and the high voltage supply line, may be arranged in at least one of one side region and the other side region of the substrate 111, or the touch pads 170 and the display pads 180 may be arranged in different regions of the non-active area. Arrangement of the touch pads 170 and the display pads 180 is not limited to the structure of FIG. 2, and may be variously changed according to design specifications of the display device.

The touch pads 170 and the display pads 180 are arranged on at least one insulating film selected from the buffer layer 112, the interlayer insulating film 114 and the protective film 116, which are arranged between the substrate 111 and the encapsulation unit 140, and contact the at least one insulating film. For example, the touch pads 170 and the display pads 180 may be arranged on the interlayer insulating film 114.

Each of the display pads 180 arranged on the interlayer insulating film 114 includes a display pad electrode 182 and a display cover electrode 184, as exemplarily shown in FIG. 3.

The display pad electrode 182 is formed to be connected to at least one of the scan line SL, the data line, the low voltage (VSS) supply line and the high voltage (VDD) supply line in the active area in which the light emitting elements 120 are formed. The display pad electrode 182 is formed of the same material as at least one of the gate electrode 132 or the source and drain electrodes 136 and 138 of the driving transistor 130 (T2) so as to have a monolayer or multilayer structure on the same plane as the at least one of the gate electrode 132 or the source and drain electrodes 136 and 138. For example, the display pad electrode 172 having a monolayer structure is formed of the same material as the source and drain electrodes 136 and 138, on the interlayer insulating film 114, or is formed of the same material as the gate electrode 132, on the substrate 111. The display pad 172 having a multilayer structure includes a first display pad electrode (not shown) formed of the same material as the gate electrode 132, on the substrate 111, and a second display pad electrode (not shown) formed of the same material as the source and drain electrodes 136 and 138, on the interlayer insulating film 114 and connected to the first display pad electrode.

The display cover electrode 184 is arranged to cover the display pad electrode 182. The display cover electrode 184 is formed of the same material as the first bridges 152b through the same mask process as the first bridges 152b. That is, the display cover electrode 184 includes the opaque conductive layer 161 and the transparent conductive layer 163 arranged on or under the opaque conductive layer 161. Here, in the display cover electrode 184, the transparent conductive layer 163 having high corrosion resistance and acid resistance may be arranged as the uppermost layer.

The touch pads 170 are formed of the same material as the first bridges 152b through the same mask process as the first bridges 152b. That is, the touch pad 170 includes the opaque conductive layer 161 and the transparent conductive layer 163 arranged on or under the opaque conductive layer 161, as exemplarily shown in FIGS. 3 and 4. Here, in the touch pad 170, the transparent conductive layer 163 having high corrosion resistance and acid resistance may be arranged as the uppermost layer. Otherwise, the touch pad 170 may be formed by extending the transparent conductive layer 163 of the lower routing line 162 to a pad area, as exemplarily shown in FIG. 5.

As such, among a plurality of conductive layers included in the touch sensor in accordance with the present disclosure, the second bridges 154b and the routing lines 160 arranged as the uppermost layer have a monolayer or multilayer structure using at least one selected from the group consisting of Ti, Ta, Cr, Mo, MoTi, Al, Ag, Au and Co. For example, the second bridges 154b and the routing lines 160 have a three-layer structure, such as Ti/Al/Ti or Mo/Al/Mo. In order to prevent lowering of visibility caused by reflection of external light by the second bridges 154b and the routing lines 160, an anti-reflective film 110 is arranged on the second bridges 154b and the routing lines 160. The anti-reflective film 110 is formed of a photosensitive material including a black pigment. The black pigment included in the anti-reflective film 110 may reduce reflection of external light even if the second bridges 154b and the routing lines 160 are not formed of a high-priced low reflectivity metal.

Figure 6:
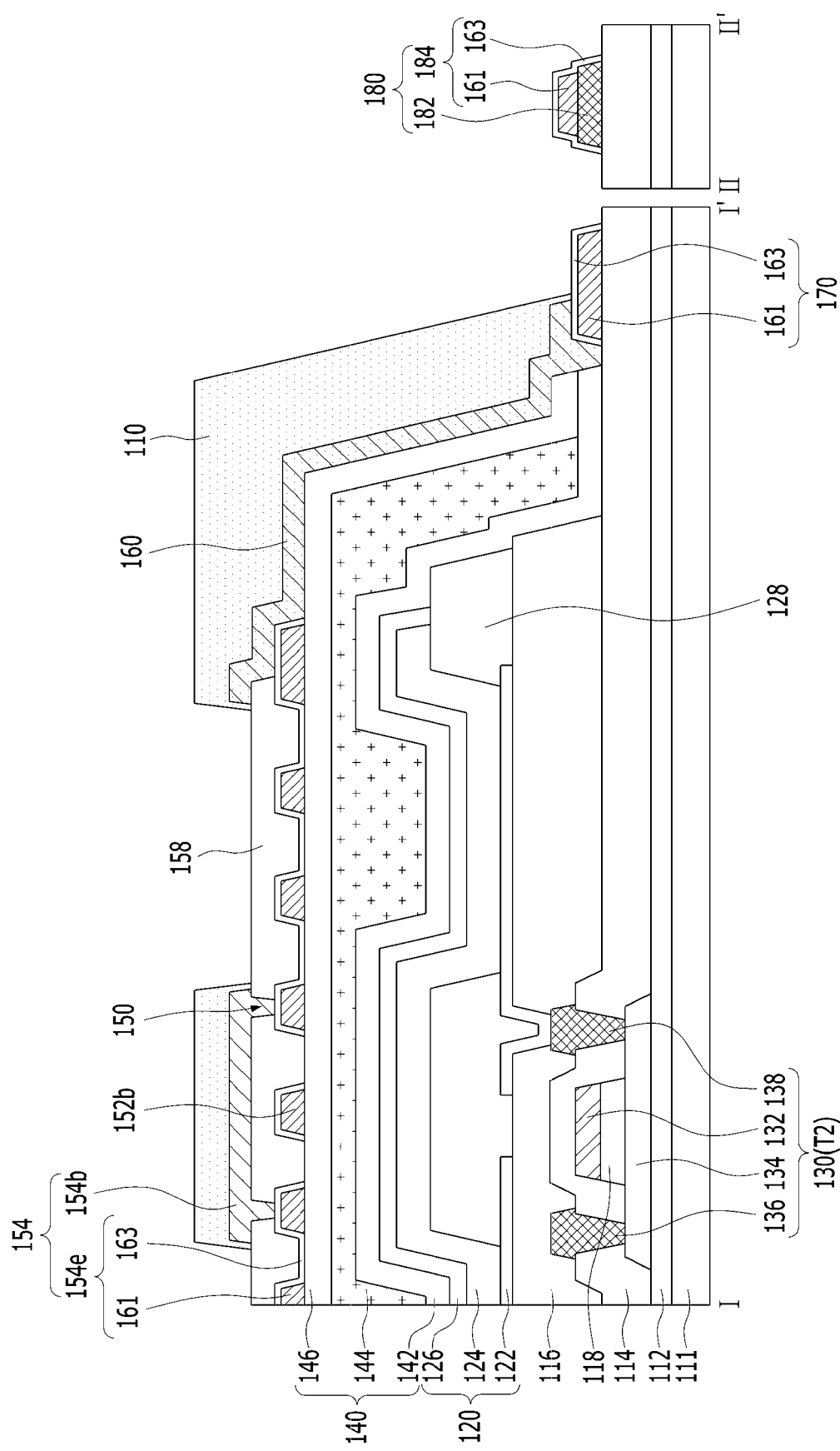
FIG. 6 is a cross-sectional view illustrating another embodiment of an anti-reflective layer shown in FIG. 3.

Such an anti-reflective film 110 is formed to have any one of the structures shown in FIGS. 5 and 6.

The anti-reflective film 110 shown in FIG. 5 is formed on the second bridges 154b and the routing lines 160 so as to have the same line width as the second bridges 154b and the routing lines 160. Thereby, the anti-reflective film 110 may prevent reflection of external light through the upper surfaces of the second bridges 154b and the routing lines 160.

The anti-reflective film 110 shown in FIG. 6 is formed on the second bridges 154b and the routing lines 160 so as to have a greater line width than the second bridges 154b and the routing lines 160. That is, the anti-reflective film 110 shown in FIG. 6 is formed to cover the side and upper surfaces of the second bridges 154b and the routing lines 160. Thereby, the anti-reflective film 110 may prevent reflection of external light through the side and upper surfaces of the second bridges 154b and the routing lines 160.

FIGS. 7A to 7D are cross-sectional views illustrating a method of manufacturing the organic light emitting display device shown in FIG. 3.

First, the opaque conductive layer 161 and the transparent conductive layer 163 are deposited on the whole surface of the substrate 111 provided with the switching transistors T1, the driving transistors 130 (T2), the light emitting elements 120, the display pad electrodes 182 and the encapsulation unit 140 formed thereon, through a deposition process. Thereafter, the opaque conductive layer 161 and the transparent conductive layer 163 are patterned through a photolithography process and an etching process, thus forming the first and second touch electrodes 152e and 154e, the first bridges 152b, the touch pads 170 and the display cover electrodes 184, as exemplarily shown in FIG. 7A. Here, each of the first and second touch electrodes 152e and 154e, the first bridges 152b, the touch pads 170 and the display cover electrodes 184 has a structure in which the opaque conductive layer 161 and the transparent conductive layer 163 are stacked in regular order or in reverse order.

Figure 7A:
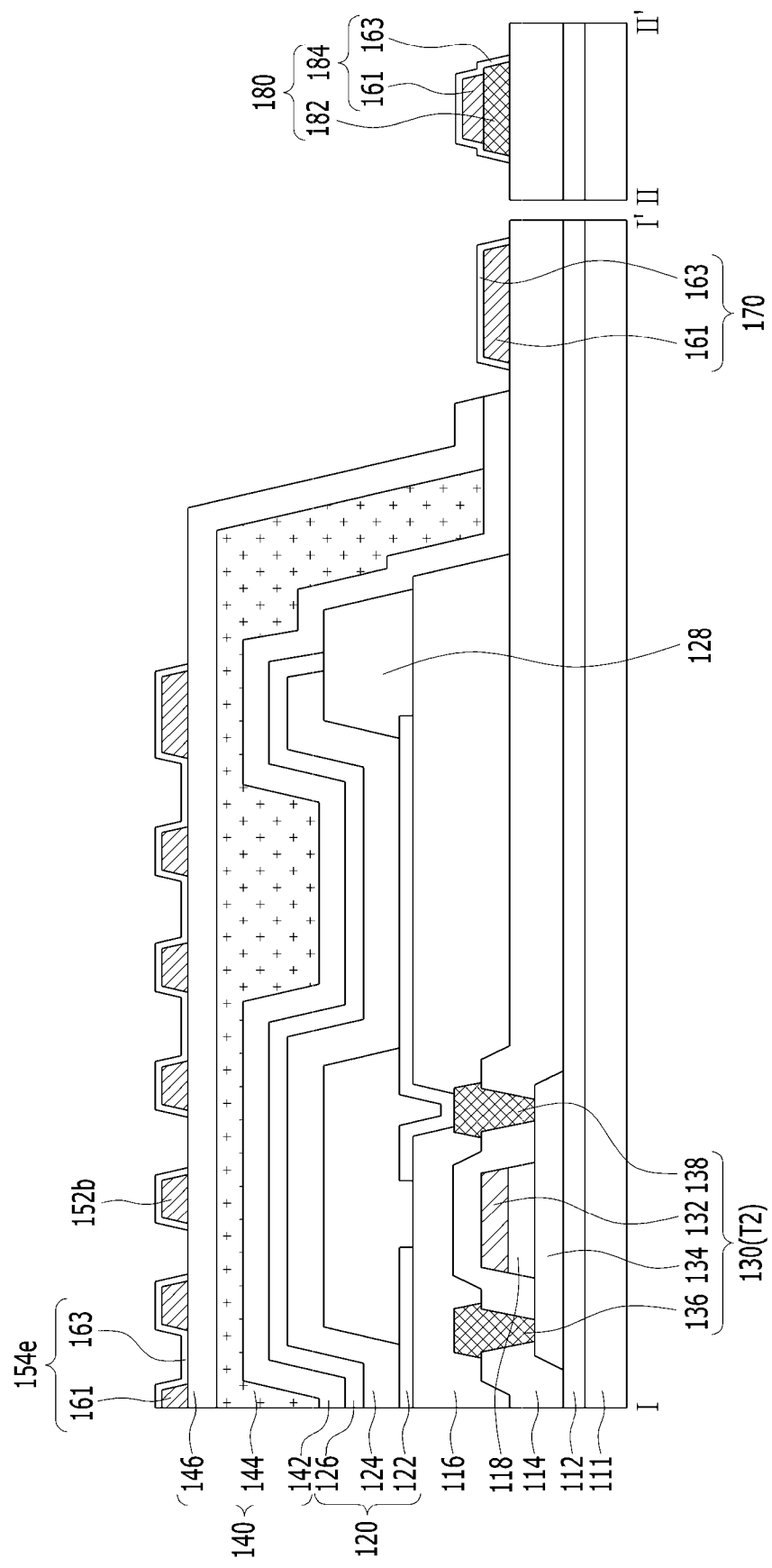
FIGS. 7A to 7D are cross-sectional views illustrating a method of manufacturing the organic light emitting display device shown in FIG. 3.
Figure 7B:
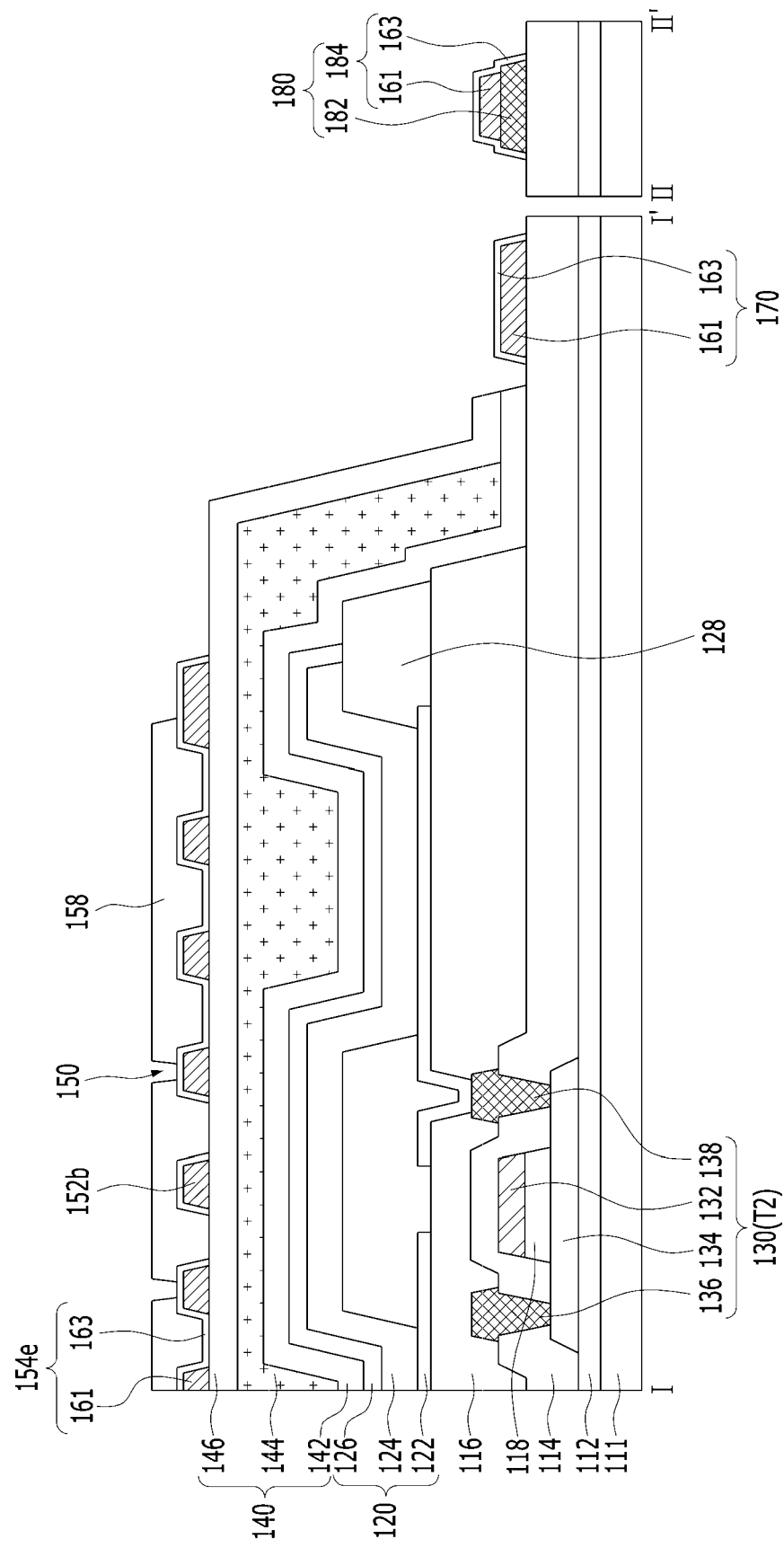

Thereafter, an inorganic or organic insulating material is deposited on the substrate 111 provided with the first and second touch electrodes 152e and 154e, the first bridges 152b, the touch pads 170 and the display cover electrodes 184 formed thereon, thus forming the touch insulating film 158, as exemplarily shown in FIG. 7B. Here, as the touch insulating film 158, an inorganic film, such as $SiN_x$, SiON or $SiO_x$, or an organic film, such as an acrylic-based organic film, an epoxy-based organic film, Parylene-C, Parylene-N, Parylene-F or a siloxane-based organic film, may be used. Thereafter, the touch insulating film 158 is patterned through a photolithography process and an etching process, thus forming the touch contact holes 150.

Figure 7C:
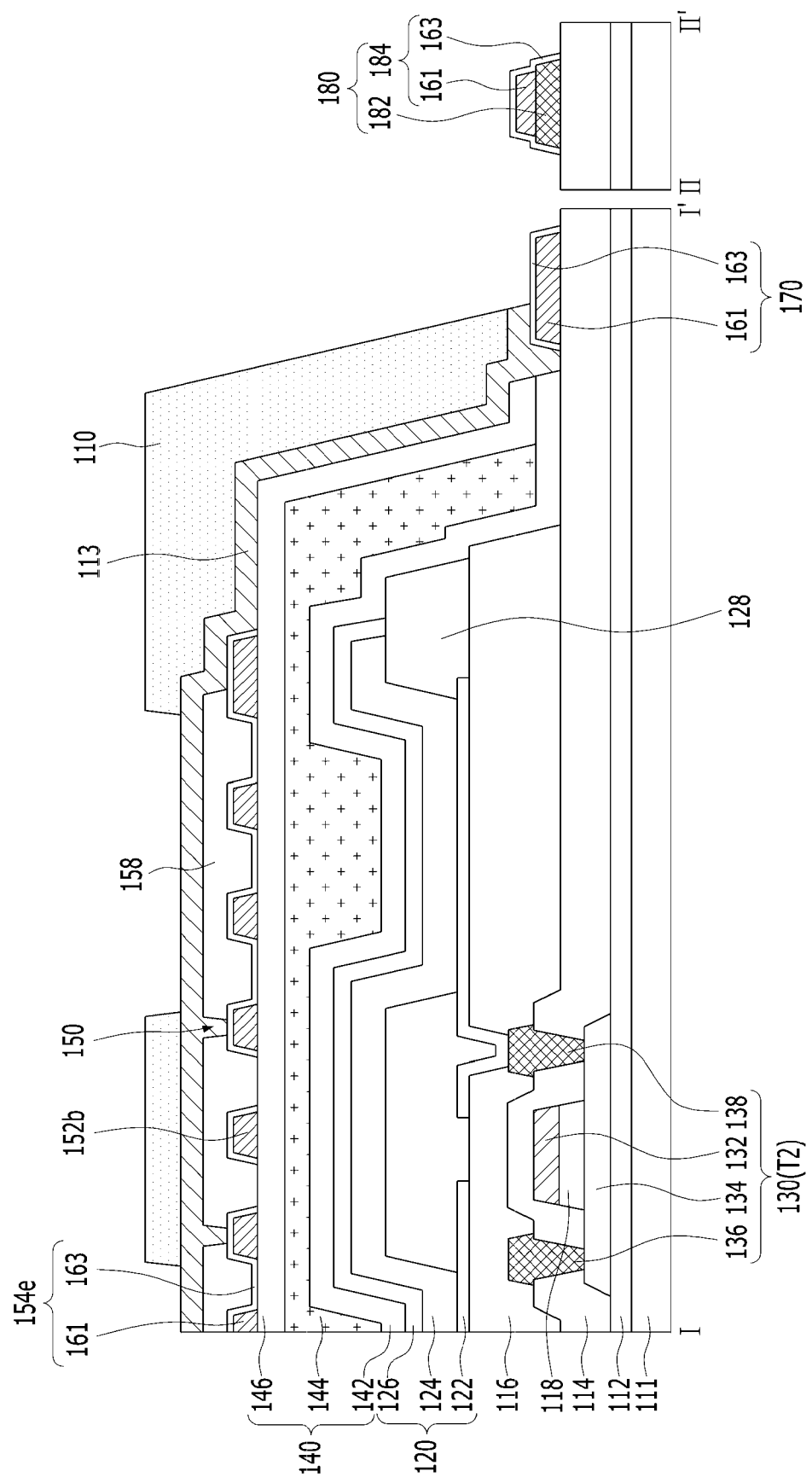
Figure 7D:
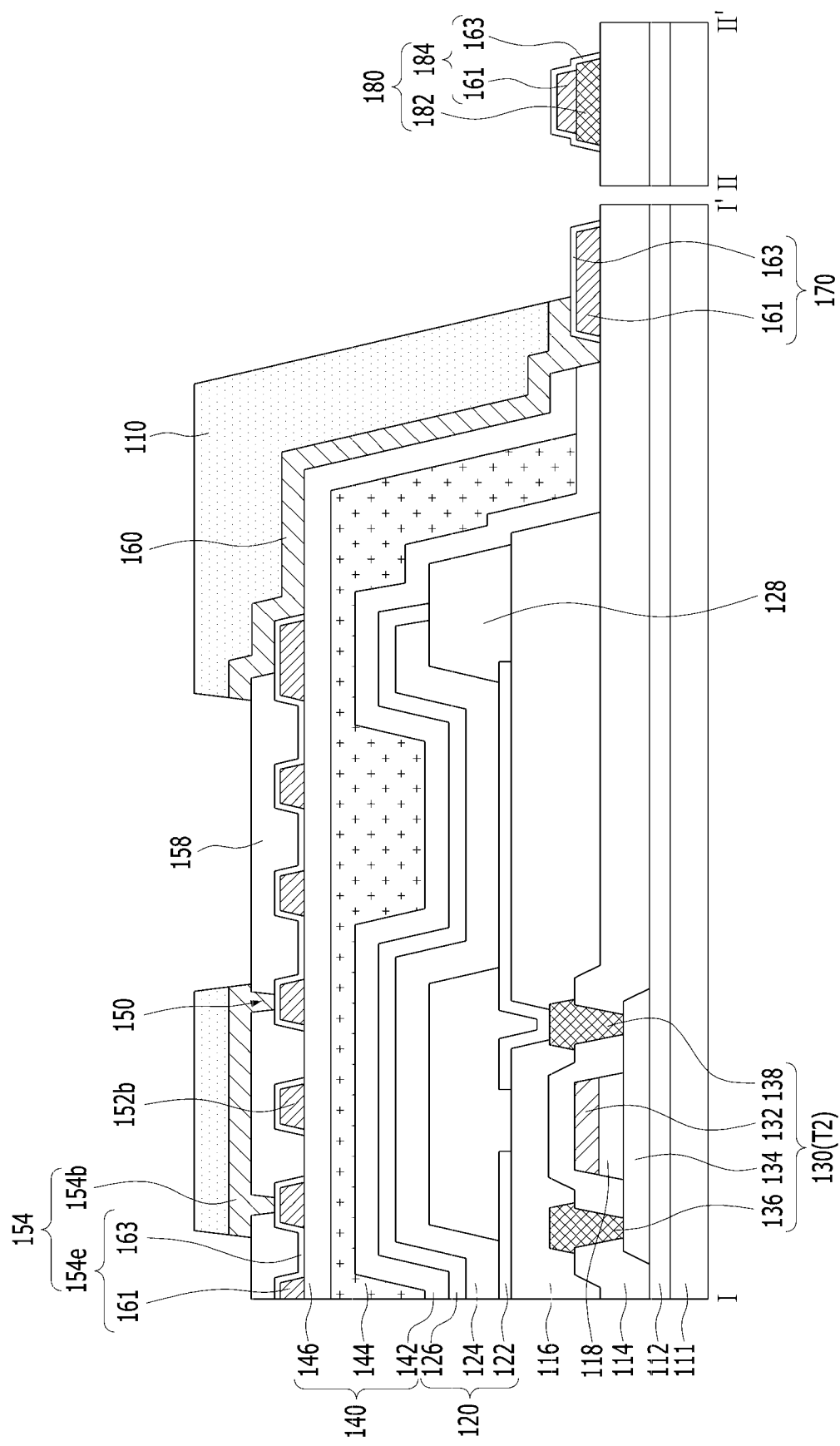

Thereafter, an uppermost conductive layer 113 is deposited on the whole surface of the touch insulating film 158 provided with the touch contact holes 150, as exemplarily shown in FIG. 7C. A photosensitive film including a black pigment is deposited on the whole surface of the uppermost conductive layer 113 and then patterned through a photolithography process, thus forming the anti-reflective film 110. The uppermost conductive layer 113 is patterned through an etching process using the anti-reflective film 110 as a mask, thus forming the second bridges 154b and the routing lines 160, as exemplarily shown in FIG. 7D. The anti-reflective film 110 shown in FIG. 5 is formed to cover the side surfaces of the second bridges 154b and the routing lines 160 by reflow through a curing process, after formation of the second bridges 154b and the routing lines 160. During the curing process, the anti-reflective film 110 is cured at a temperature which may not damage the light emitting elements 120.

As such, in the present disclosure, the anti-reflective film 110 including the photosensitive material and the black pigment is arranged on the second bridges 154b and the routing lines 160 serving as the uppermost layer out of a plurality of conductive layers included in the touch sensor. Therefore, the anti-reflective film 110 may prevent reflection of external light even if a high-priced low reflective metal is not used and, thus, visibility may be improved. Further, since the anti-reflective film 110 protects the second bridges 154b and the routing lines 160, an additional structure to protect the second bridges 154b and the routing lines 160 is not required and thus the structure and manufacturing process of the display device are simplified. Moreover, after patterning of the second bridges 154b and the routing lines 160 using the anti-reflective film 110 including the photosensitive material and the black pigment, the anti-reflective film 110 is not stripped and remains on the second bridges 154b and the routing lines 160. Thereby, an additional process to form the second bridges 154b and the routing lines 160 is not required and a stripping process of the anti-reflective film 110 may be omitted and thus the manufacturing process of the display device is simplified.

Figure 8:
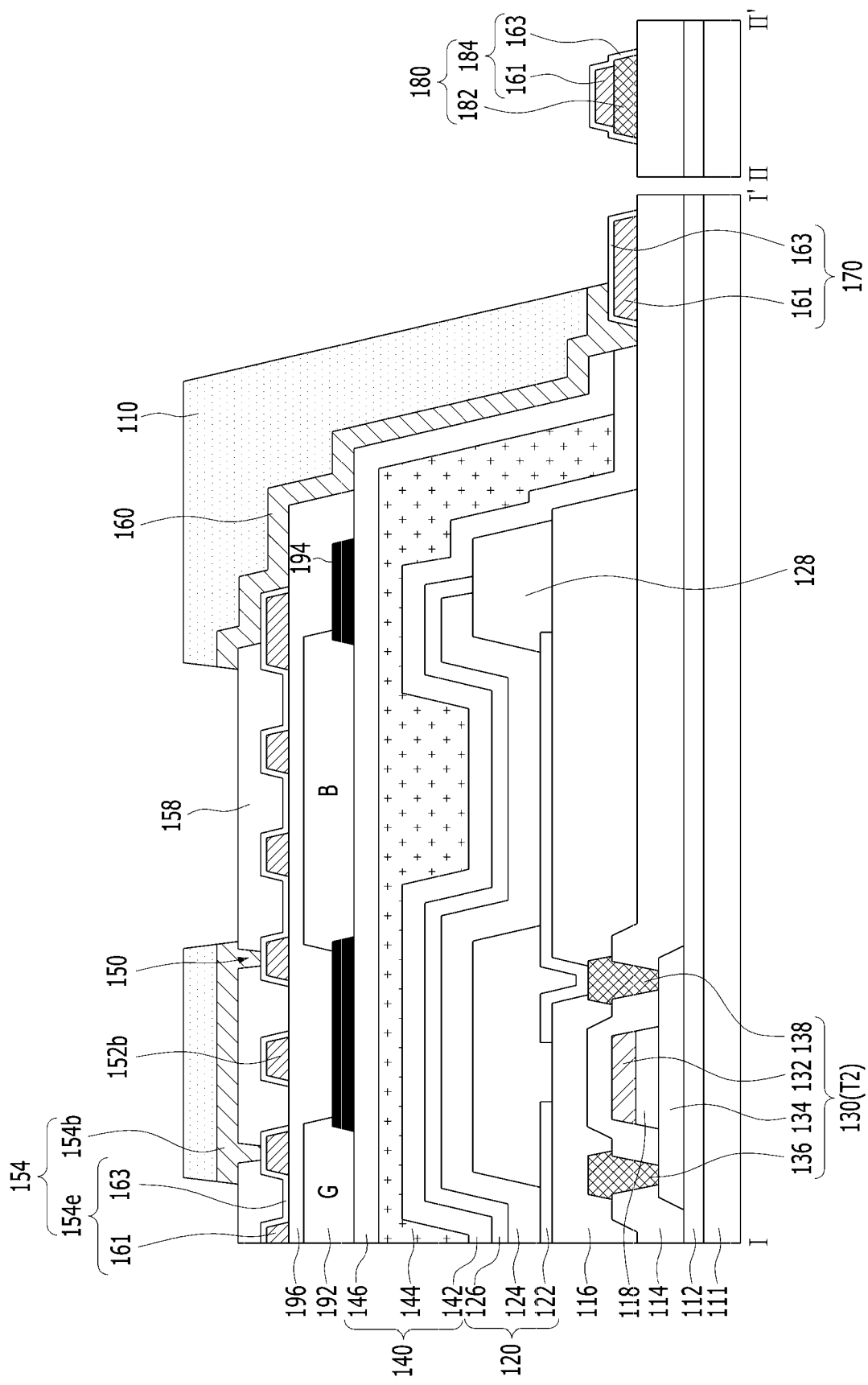
FIG. 8 is a cross-sectional view illustrating an organic light emitting display device having touch sensors in accordance with another embodiment of the present disclosure.

FIG. 8 is a cross-sectional view illustrating an organic light emitting display device having touch sensors in accordance with another embodiment of the present disclosure.

The organic light emitting display device shown in FIG. 8 includes the same elements as the organic light emitting display device shown in FIG. 3 except that color filters 192 arranged between an encapsulation unit 140 and touch electrodes 152e and 154e are further provided. Therefore, a detail description of the elements of the organic light emitting display device in accordance with this embodiment, which are the same as those of the organic light emitting display device in accordance with the earlier embodiment, will be omitted.

The color filter 192 is formed between each of touch driving and sensing lines 152 and 154 and a light emitting element 120. A distance between each of the touch driving and sensing lines 152 and 154 and the light emitting element 120 is increased by the color filter 192. Therefore, a capacitance value of a parasitic capacitor formed between each of the touch driving and sensing lines 152 and 154 and the light emitting element 120 may be minimized and, thus, mutual influence between each of the touch driving and sensing lines 152 and 154 and the light emitting element 120 due to coupling therebetween may be prevented. Further, the color filters 192 may prevent a liquid chemical (a developing solution or an etching solution) used during a manufacturing process of the touch sensing lines 154 and the touch driving lines 152 or external moisture from penetrating into a light emitting stack 124. Therefore, the color filters 192 prevent damage to the light emitting stack 124 which is vulnerable to a liquid chemical or moisture. Further, although FIG. 8 exemplarily illustrates that the touch electrodes 152e and 154e are arranged on the color filters 192, the color filters 192 may be arranged on the touch electrodes 152e and 154e. In this case, the touch electrodes 152e and 154e are arranged between the color filters 192 and the encapsulation unit 140.

A black matrix 194 is arranged between the color filters 192. The black matrix 194 serves to divide respective sub-pixel regions from each other and to prevent optical coherence and light leakage between neighboring sub-pixel regions. The black matrix 194 is formed of a black insulating material having high resistance, or is formed by stacking at least two color filters selected from the group consisting of red (R), green (G) and blue (B) color filters. Further, a touch planarization film 196 is formed on the substrate 111 provided with the color filters 192 and the black matrix 194 formed thereon. The touch planarization film 196 flattens the substrate 111 provided with the color filters 192 and the black matrix 194 formed thereon.

Figure 9A:
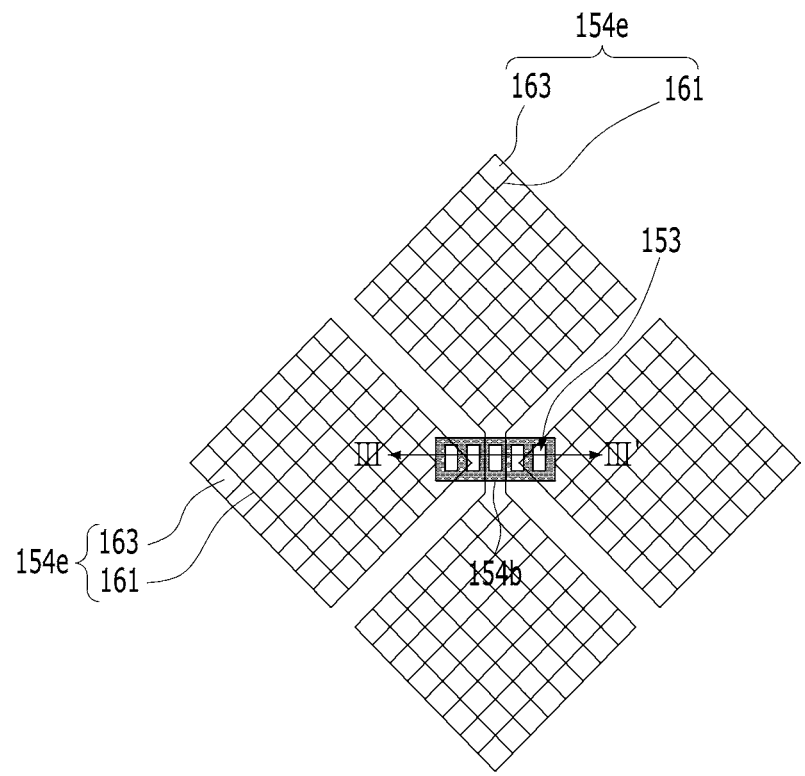
FIGS. 9A and 9B are plan and cross-sectional views, respectively, illustrating another type of a bridge of an organic light emitting display device having touch sensors in accordance with the present disclosure.
Figure 9B:
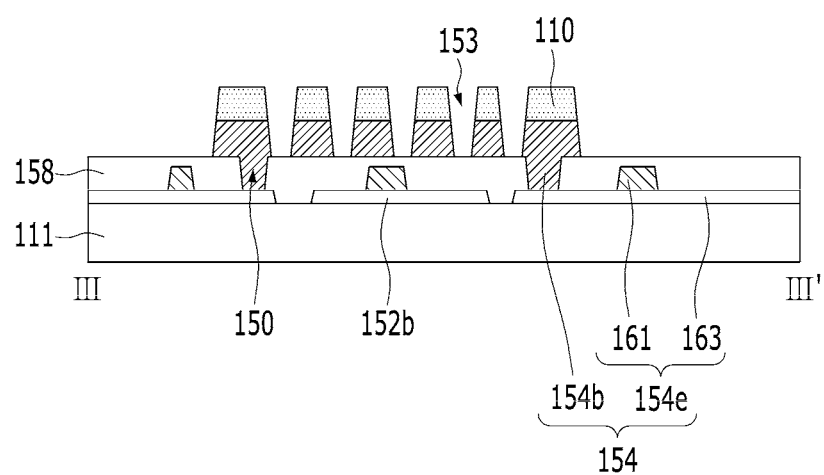

The first and second bridges 152b and 154b in accordance with the present disclosure may include a plurality of slits 153, as exemplarily shown in FIGS. 9A and 9B. The second bridge 154b including the slits 153 shown in FIGS. 9A and 9B may have a reduced area, as compared to the second bridge 154b including no slits shown in FIG. 3. Therefore, reflection of external light by the second bridges 154b may be reduced and, thus, lowering of visibility may be prevented. In this case, an anti-reflection film 110 arranged on the second bridges 154b is formed to have slits of the same shape as the slits 153 of the second bridges 154b.

Further, although the present disclosure exemplarily describes a structure in which each of the first and second touch electrodes 152e and 154e and the first bridges 152b includes the mesh-type opaque conductive layer 161, each of the first and second touch electrodes 152e and 154e and the first bridges 152b may include only the transparent conductive layer 163 without the mesh-type opaque conductive layer 161.

As apparent from the above description, in a display device in accordance with the present disclosure, an anti-reflective film including a black pigment may prevent reflection of external light and, thus, visibility may be improved. Further, since the anti-reflective film protects second bridges and routing lines, an additional structure to protect the second bridges and the routing lines is not required and thus the manufacturing process of the display device is simplified. Further, a stripping process of the anti-reflective film is omitted and thus the manufacturing process of the display device is simplified. Moreover, while a touchscreen is attached to a conventional organic light emitting display device through an adhesive, touch electrodes are arranged on an encapsulation unit of the display device in accordance with the present disclosure without a separate attachment process and, thus, process simplification and cost reduction may be achieved.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   light emitting elements arranged on a substrate;
   an encapsulation unit arranged on the light emitting elements, wherein the encapsulation unit comprises a plurality of inorganic encapsulation layers and at least one organic encapsulation layer;
   a plurality of touch sensors arranged on the encapsulation unit, the touch sensors including a plurality of conductive layers;
   routing lines respectively connected to the touch sensors and disposed along a lateral surface of an inorganic encapsulation layer of the plurality of inorganic encapsulation layers that covers a lateral surface of the organic encapsulation layer; and
   an anti-reflective film arranged on the routing lines and on an uppermost layer among the plurality of conductive layers included in the touch sensors, the anti-reflective film including a photosensitive material and a black pigment.

2. A display device, comprising:
   light emitting elements arranged on a substrate;
   an encapsulation unit arranged on the light emitting elements;
   a plurality of touch sensors arranged on the encapsulation unit, the touch sensors including a plurality of conductive layers;
   routing lines respectively connected to the touch sensors and disposed along a lateral surface of the encapsulation unit; and
   an anti-reflective film arranged on the routing lines and on an uppermost layer among the plurality of conductive layers included in the touch sensors, the anti-reflective film including a photosensitive material and a black pigment,
   wherein the touch sensors comprise touch sensing lines and touch driving lines arranged on the encapsulation unit,
   wherein each of the touch driving lines comprises:
   first touch electrodes arranged in a first direction on the encapsulation unit; and
   first bridges configured to connect the first touch electrodes,
   wherein each of the touch sensing lines comprises:
   second touch electrodes arranged in a second direction intersecting the first direction; and
   second bridges configured to connect the second touch electrodes.

3. The display device according to claim 2, wherein the anti-reflective film is arranged on the second bridges and the routing lines, the anti-reflective film having a same line width as the second bridges and the routing lines.

4. The display device according to claim 2, wherein the anti-reflective film is arranged on the second bridges and the routing lines, the anti-reflective film having a greater line width than the second bridges and the routing lines.

5. The display device according to claim 2, wherein the anti-reflective film is arranged on the second bridges and the routing lines, and the anti-reflective film covers side and upper surfaces of the second bridges and the routing lines.

6. The display device according to claim 2, wherein each of the second bridges and the routing lines has a monolayer or multilayer structure including at least one of Ti, Ta, Cr, Mo, MoTi, Al, Ag, Au and Co.

7. The display device according to claim 2, wherein each of the second bridges and the routing lines has a multilayer structure of Ti/Al/Ti.

8. The display device according to claim 2, wherein at least one of the first bridges and the second bridges includes at least one slit.

9. The display device according to claim 1, further comprising color filters arranged between the encapsulation unit and the touch sensors.

10. The display device according to claim 1, further comprising color filters arranged on the touch sensors,
    wherein the touch sensors are arranged between the color filters and the encapsulation unit.

11. A display device comprising:
    light emitting elements arranged on a substrate;
    an encapsulation unit arranged on the light emitting elements;
    a plurality of touch sensors arranged on the encapsulation unit, the touch sensors including a plurality of conductive layers;
    routing lines respectively connected to the touch sensors;
    an anti-reflective film arranged on the routing lines and on an uppermost layer among the plurality of conductive layers included in the touch sensors, the anti-reflective film including a black pigment;
    at least one insulating film arranged between the substrate and the encapsulation unit;
    a plurality of touch pads connected to the routing lines;
    thin film transistors connected to the light emitting elements; and
    display pads connected to the thin film transistors and arranged on the substrate,
    wherein the display pads and the touch pads contact the at least one insulating film.

12. The display device according to claim 11, further comprising:
    a buffer layer arranged between an active layer of the thin film transistors and the substrate;
    an interlayer insulating film arranged between gate electrodes and source and drain electrodes of the thin film transistors; and
    a protective film arranged between the source and drain electrodes and the light emitting elements,
    wherein the at least one insulating film includes at least one of the buffer layer, the interlayer insulating film and the protective film.

13. The display device according to claim 2, wherein the second bridges include the uppermost layer of the touch sensors.

* * * * *